(12) United States Patent
Patra et al.

(10) Patent No.: US 9,535,331 B2
(45) Date of Patent: Jan. 3, 2017

(54) OPTICAL SYSTEM FOR A MICROLITHOGRAPHIC PROJECTION EXPOSURE APPARATUS

(71) Applicant: Carl Zeiss SMT GmbH, Oberkochen (DE)

(72) Inventors: Michael Patra, Oberkochen (DE); Johannes Eisenmenger, Ulm (DE); Markus Schwab, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 186 days.

(21) Appl. No.: 14/336,651

(22) Filed: Jul. 21, 2014

(65) Prior Publication Data
US 2015/0029477 A1    Jan. 29, 2015

(30) Foreign Application Priority Data

Jul. 24, 2013 (DE) .......................... 10 2013 214 459

(51) Int. Cl.
*G03B 27/52* (2006.01)
*G03B 27/42* (2006.01)
(Continued)

(52) U.S. Cl.
CPC ....... *G03F 7/70058* (2013.01); *G02B 17/0663* (2013.01); *G03F 7/70116* (2013.01)

(58) Field of Classification Search
CPC ............ G02B 26/0833; G02B 27/0927; G02B 27/0944; G02B 26/105; G02B 27/0905; G02B 26/0841; G02B 26/085; G02B 26/101; G02B 27/0961; G02B 27/0966; G02B 21/06; G02B 27/0933; G02B 27/095; G02B 26/02; G02B 26/0808; G02B 26/0816; G02B 26/0875
See application file for complete search history.

(56) References Cited

U.S. PATENT DOCUMENTS 6,977,718 B1    12/2005  LaFontaine
2006/0055834 A1  3/2006  Tanitsu
(Continued)

FOREIGN PATENT DOCUMENTS

DE    10 2011 082 481 A1    12/2012
JP       2005/156592         6/2005
(Continued)

OTHER PUBLICATIONS

The Extended European Search Report for EP 14177805.0, dated Dec. 16, 2014.
(Continued)

*Primary Examiner* — Mesfin Asfaw
(74) *Attorney, Agent, or Firm* — Fish & Richardson P.C.

(57) ABSTRACT

An optical system for a microlithographic projection exposure apparatus has an optical axis, at least one mirror arrangement having a plurality of mirror elements that are adjustable independently of one another for altering an angular distribution of the light reflected by the mirror arrangement, and a deflection device which includes, relative to the optical beam path downstream of the mirror arrangement, at least one deflection surface at which a deflection of the optical axis occurs. The at least one deflection surface has refractive power.

22 Claims, 4 Drawing Sheets

(51) Int. Cl.
*G03F 7/20* (2006.01)
*G02B 17/06* (2006.01)

(56) References Cited

U.S. PATENT DOCUMENTS

| | | | |
|---|---|---|---|
| 2009/0097094 A1* | 4/2009 | Tanaka | G03F 7/70075 359/239 |
| 2009/0109417 A1 | 4/2009 | Tanitsu | |
| 2009/0115990 A1* | 5/2009 | Owa | G02B 26/0833 355/71 |
| 2009/0116093 A1 | 5/2009 | Tanitsu | |
| 2011/0027724 A1 | 2/2011 | Tanaka | |
| 2011/0069305 A1 | 3/2011 | Tanitsu et al. | |
| 2011/0117503 A1 | 5/2011 | Uemura | |

FOREIGN PATENT DOCUMENTS

| | | |
|---|---|---|
| JP | 2009/105396 | 5/2009 |
| JP | 2011/108851 | 6/2011 |
| JP | 2011-108851 A | 6/2011 |
| WO | WO 2005/026843 A2 | 3/2005 |
| WO | WO 2009/125511 | 10/2009 |
| WO | WO 2009/145048 | 12/2009 |
| WO | WO 2012/100791 | 8/2012 |

OTHER PUBLICATIONS

Korean Office Action, with translation thereof, for KR Appl No. 2014-0093954, dated Nov. 17, 2015.

Andrew Lynch, "Beam manipulation prisms vs. mirrors," Photonik International, vol. 2009, No. 2, Nov. 12, 2009, pp. 45-47.

German Office Action, with translation thereof, for corresponding DE Appl No. 10 2013 214 459.8 dated Feb. 14, 2014.

Japanese Office Action with English translation thereof for corresponding Appln. No. JP2014-150440, dated Jun. 24, 2015.

* cited by examiner

OPTICAL SYSTEM FOR A MICROLITHOGRAPHIC PROJECTION EXPOSURE APPARATUS

CROSS-REFERENCE TO RELATED APPLICATION

This application claims priority under 35 U.S.C. §119 to German patent application serial number 10 2013 214 459.8, filed Jul. 24, 2013, the entire contents of which are incorporated by reference herein.

FIELD

The disclosure relates to an optical system for a microlithographic projection exposure apparatus.

BACKGROUND

Microlithographic projection exposure apparatuses are used for producing microstructured components, such as integrated circuits or LCDs, for example. Such a projection exposure apparatus has an illumination device and a projection lens. In the microlithographic process, the image of a mask (=reticle) illuminated with the aid of the illumination device is projected via the projection lens onto a substrate (e.g. a silicon wafer) coated with a light-sensitive layer (photoresist) and arranged in the image plane of the projection lens, in order to transfer the mask structure to the light-sensitive coating of the substrate.

During the operation of a microlithographic projection exposure apparatus, it is desirable to set defined illumination settings, i.e. intensity distributions in a pupil plane of the illumination device, in a targeted manner. For this purpose, in addition to the use of diffractive optical elements (so-called DOEs), the use of mirror arrangements is also known, e.g. from WO 2005/026843 A2. Such mirror arrangements include a multiplicity of micromirrors that can be set independently of one another, and enable the flexible variation of the intensity distribution set in the illumination device.

In this case, in practice the maximum settable tilting angles of the mirror elements within such a mirror arrangement for setting the respectively desired illumination settings are limited (typically to a few degrees), in order to avoid mechanical problems when realizing the tilting of the mirror elements (e.g. owing to an instability of the flexures typically used there) and, if appropriate, problems appertaining to the dissipation of heat in the region of the mirror arrangement. This restriction of the maximum tilting angles within the mirror arrangement in turn has the effect that a Fourier optical unit that is typically used in the illumination device and serves for converting the angular distribution of the illumination light into a spatial distribution in the pupil plane typically has to have relatively long focal lengths (e.g. several meters).

In order to realize these focal lengths with a still tenable outlay, it is known to configure the Fourier optical unit as an optical zoom system with a plurality of refractive lens elements, but in principle this increases the outlay in respect of material and costs. Furthermore, the configuration of the Fourier optical unit as an optical zoom system with a plurality of refractive lens elements can also mean an increased structural outlay in the configuration of the optical design of the projection exposure apparatus insofar as e.g. the accommodation of supporting structures, which is likewise involved spatially and which desirably is not be impeded by the additional lens elements within the optical zoom system, is made more difficult.

With regard to the prior art, reference is made, merely by way of example, to WO 2005/026843 A2, US 2009/0116093 A1 and US 2006/055834 A1.

SUMMARY

The disclosure provides an optical system for a microlithographic projection exposure apparatus which enables the intensity distribution set in the illumination device to be varied flexibly in conjunction with a relatively low structural outlay and a comparatively compact design.

The disclosure provides an optical system for a microlithographic projection exposure apparatus, wherein the optical system has an optical axis, includes:

- at least one mirror arrangement having a plurality of mirror elements, wherein the mirror elements are adjustable independently of one another for altering an angular distribution of the light reflected by the mirror arrangement; and
- a deflection device having, relative to the optical beam path downstream of the mirror arrangement, at least one deflection surface at which a deflection of the optical axis occurs;
- wherein the at least one deflection surface has refractive power.

The disclosure is based on the concept, in particular, that, proceeding from the use of a mirror arrangement serving for varying the intensity distribution and having mirror elements that can be set independently of one another and a deflection device having, relative to the optical beam path downstream of the mirror arrangement, at least one deflection surface for deflecting the optical axis, the at least one deflection surface is not simply configured as a merely reflective surface (and moreover without refractive power), but rather is deliberately provided with refractive power.

This configuration of the deflection surface with refractive power advantageously has the consequence that a conversion—typically involved in the further optical beam path of an illumination device—of the angular distribution of the illumination light into a spatial distribution in a pupil plane disposed downstream in the optical beam path can be effected via an optical unit of simpler or more compact design, since, given suitable configuration of the deflection surface with regard to the refractive power provided by the deflection surface, the optical effect of the relevant Fourier optical unit that is involved for the conversion described above can already partly be implemented by the deflection surface.

The wording that the deflection surface is arranged "relative to the optical beam path downstream of the mirror arrangement" should be understood to mean that light passing through during the operation of the optical system is incident firstly on the mirror arrangement and then on the deflection surface (since the optical beam path runs from the light source in the direction toward the mask and further toward the substrate).

In this case, the disclosure is based on the consideration, in particular, that with regard to such a Fourier optical unit for converting the angular distribution of the illumination light into a spatial distribution in the pupil plane typically relatively long focal lengths (e.g. several meters) are involved, since the maximum tilting angles—which can be set within the mirror arrangement—of the mirror elements for setting the respectively desired illumination settings are limited (typically to a few degrees). In order, then, to be able to realize such comparatively long focal lengths of the Fourier optical unit in conjunction with still tenable structural lengths of the optical system or of the illumination device, a shortening of the relevant Fourier optical unit in the sense of a configuration of the Fourier optical unit as an optical zoom system is desirable.

By virtue of the fact that now according to the disclosure refractive power is already introduced into the optical system by at least one deflection surface of the deflection device and the desired optical effect of the (Fourier) optical unit can thus already partly be implemented by the deflection surface, what can be achieved is that e.g. at least one refractive lens element of the optical zoom system or of the Fourier optical unit is obviated, such that the problems described above can be avoided or alleviated.

The configuration according to the disclosure of at least one deflection surface of the deflection device with refractive power makes it possible to achieve the further advantage that the desired properties to be made of the mirror arrangement with regard to the tilting angle to be realized by the mirror elements thereof are reduced, mainly since despite a comparatively shorter structural length or compact design of the optical system it is possible to provide focal lengths of the Fourier optical unit that are long enough to produce the respectively desired illumination settings. On account of the thus possible configuration of the mirror arrangement having smaller maximum tilting angles of the mirror elements (of e.g. not more than ±3°), it is possible to avoid mechanical problems when realizing the tilting of the mirror elements (e.g. owing to an instability of the flexures typically used there) and, if appropriate, problems appertaining to the dissipation of heat in the region of the mirror arrangement.

In accordance with one embodiment, the optical system has, relative to the optical beam path between the mirror arrangement and a downstream pupil plane, exactly one deflection surface at which a deflection of the optical axis occurs.

However, the disclosure is not restricted to the configuration with exactly one deflection surface between the mirror arrangement and a downstream pupil plane. In other embodiments of the disclosure, the optical system can also have a plurality of deflection surfaces relative to the optical beam path between the mirror arrangement and a downstream pupil plane. In this case, that deflection surface which is configured with refractive power according to the disclosure is preferably the first of the deflection surfaces in the optical beam path. This configuration has the advantage that the available structural space can be utilized as optimally as possible in the case of the desired beam conversion in the optical system.

In embodiments of the disclosure, the at least one deflection surface has a positive refractive power (that is to say has a "converging effect").

In principle, a Fourier optical unit realized via an individual refractive power has a structural length having double the magnitude of its focal length, provided that the Fourier optical unit is telecentric (i.e. the Fourier optical unit converts not only angles in an input plane into locations in an output plane but also locations in an input plane into angles in an output plane). In the case of a non-telecentric Fourier optical unit, a shorter structural length is also possible when only one refractive power is used. A shortening of the structural space of a Fourier optical unit can be achieved, in particular, if the Fourier optical unit consists of a plurality of surfaces provided with refractive powers and the first refractive power of such a Fourier optical unit has a converging effect. What can be achieved via a diverging first refractive power is that the structural space is lengthened.

The "rules" indicated in the preceding paragraph describe advantageous configurations. In the event of a deviation from these rules, however, it is regularly likewise possible to obtain a fully functional Fourier optical unit (in which case, however, the other refractive powers of the Fourier optical unit are comparatively stronger and thus less expedient, if appropriate).

In accordance with one embodiment, the deflection device is configured as a prism.

In accordance with one embodiment, the deflection device has a first deflection surface arranged upstream of the mirror arrangement relative to the optical beam path and a second deflection surface arranged downstream of the mirror arrangement relative to the optical beam path, wherein a deflection of the optical axis occurs in each case both at the first deflection surface and at the second deflection surface.

In accordance with one embodiment, the mirror elements of the mirror arrangement have a maximum tilting angle of not more than 5°, in particular not more than 4°, more particularly not more than 3°.

In accordance with one embodiment, the at least one deflection surface brings about a total internal reflection for light passing through the optical system during operation. In comparison with a likewise possible realization of the deflection surface as a deflection mirror, such a configuration has the advantage of a lower light loss and thus of an improvement of the transmission properties of the optical system.

However, the disclosure is not restricted to the above-described utilization of total internal reflections. In this regard, in further configurations of the disclosure, the at least one deflection surface can also be realized as a deflection mirror. Compared with the utilization of total internal reflection, this configuration in turn has the advantage that with regard to the positioning of the deflection surface in the optical design there is no restriction of the angle of incidence at the deflection surface to values below the critical angle of total internal reflection.

In accordance with one embodiment, a Fourier optical unit is arranged downstream of the deflection device relative to the optical beam path, the Fourier optical unit converting an angular distribution of light incident on the Fourier optical unit during the operation of the optical system into a spatial distribution in a pupil plane disposed downstream in the optical beam path.

In accordance with one embodiment, the Fourier optical unit has more than one lens element. Furthermore, in embodiments of the disclosure, the Fourier optical unit has not more than four, in particular not more than three, lens elements.

In accordance with one embodiment, the optical system is designed for an operating wavelength of less than 250 nm, in particular less than 200 nm, more particularly less than 160 nm.

The disclosure furthermore relates to a microlithographic projection exposure apparatus and to a method for microlithographically producing microstructured components.

Further configurations of the disclosure can be gathered from the description and from the dependent claims.

The disclosure is explained in greater detail below on the basis of exemplary embodiments illustrated in the accompanying figures.

DETAILED DESCRIPTION

One basic possible construction of a microlithographic projection exposure apparatus including an optical system according to the disclosure is firstly explained below with reference to FIG. 1. The fundamental construction illustrated in FIG. 1 is known e.g. from US 2009/0116093 A1 and as such does not belong to the claimed subject matter of the present application.

Figure 1:
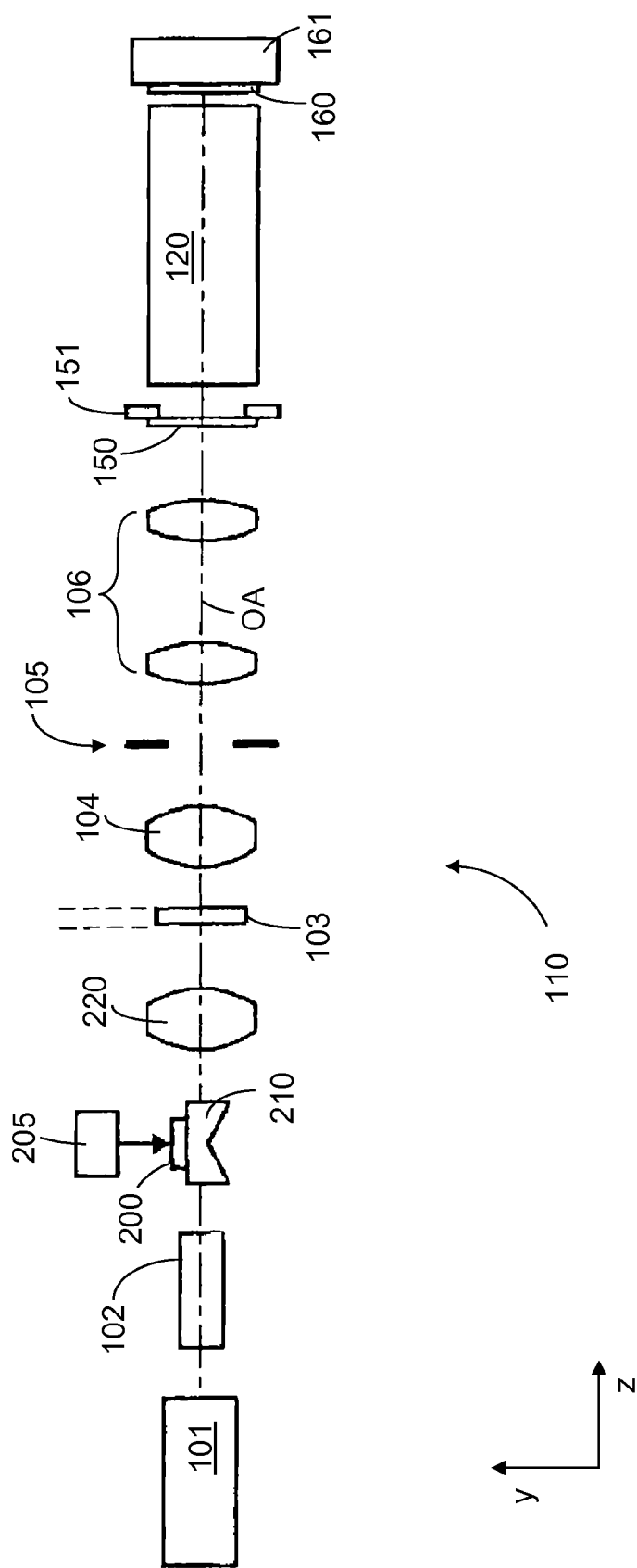
FIG. 1 shows a schematic illustration for elucidating the possible construction of a microlithographic projection exposure apparatus including an optical system according to the disclosure.

The projection exposure apparatus in accordance with FIG. 1 has an illumination device 110 and a projection lens 120. The illumination device 110 serves for illuminating a structure-bearing mask (reticle) 150 with light from a light source unit 101, which includes for example an ArF excimer laser for an operating wavelength of 193 nm and a beam shaping optical unit that generates a parallel light beam. Generally, the illumination device 110 and the projection lens 120 are preferably designed for an operating wavelength of less than 250 nm, in particular less than 200 nm, more particularly less than 160 nm.

In accordance with FIG. 2 part of the illumination device 110 is, in particular, a mirror arrangement 200, as explained in further detail below with reference to FIG. 2 et seq. Such a mirror arrangement 200 is sometimes also designated as MMA ("micromirror array") or else as spatial light modulator and has—as indicated schematically in FIG. 2—a plurality of mirror elements 200a, 200b, 200c, ... which are adjustable independently of one another for altering an angular distribution of the light reflected by the mirror arrangement 200. This adjustment is driven in accordance with FIG. 1 via a driving unit 205 using suitable actuators. The mirror elements 200a, 200b, 200c, ... can each be tilted individually, e.g. in an angular range of −2.5° to +2.5°. Upstream of the mirror arrangement 200 in the light propagation direction, in a manner known per se a microlens element arrangement (not illustrated) can be provided, having a multiplicity of microlens elements for targeted focusing onto the mirror elements 200a, 200b, 200c, ... and for reducing or avoiding light loss and stray light generation in the regions between the mirror elements 200a, 200b, 200c, ... as a result of spillover from the mirror elements.

Via a suitable tilting arrangement of the mirror elements 200a, 200b, 200c, ... in the mirror arrangement 200, a desired light or intensity distribution, e.g. an annular illumination setting or else a dipole setting or a quadrupole setting, can be formed in a pupil plane of the illumination device 110 from FIG. 1 by virtue of the (if appropriate previously homogenized and collimated) laser light being directed in each case in the corresponding direction by the mirror elements 200a, 200b, 200c, ... of the mirror arrangement 200 depending on the desired illumination setting.

In accordance with FIG. 1, the light coming from the light source unit 101 and a device 102 for setting the polarization state, before being incident on the mirror arrangement 200, firstly impinges on a deflection device 210, by which the illumination light is deflected in the direction of the mirror arrangement 200 at a first deflection surface 211 of the deflection device 210 and, after reflection at the mirror arrangement 200, is deflected again along the original propagation direction by a second deflection surface 212 of the deflection device 210. Consequently, the deflection device 210 has a respective deflection surface 211 and 212 both upstream and downstream of the mirror arrangement 200 relative to the light propagation direction.

The deflection device 210 firstly makes it possible for the mirror arrangement 200, which serves for flexibly setting different illumination settings, to be used in the manner of a module (comparable as it were to the "plug-and-play" principle) in an illumination device equipped with a diffractive optical element (DOE) for setting a desired illumination setting, for example, by the replacement of the DOE, since the illumination light is coupled out from the optical beam path and is coupled into the optical beam path again in a simple manner via the deflection device 210 and without the requirement for further modifications in the rest of the optical design of the illumination device.

In other words, according to the disclosure, in conjunction with complete compatibility with the present optical design of the respectively existing illumination device equipped with a DOE, for example, the illumination device can additionally be equipped to the effect that different illumination settings can additionally be set in a flexible manner by virtue of the DOE being exchanged for the module according to the disclosure. The above-described input and output coupling of the illumination light is furthermore advantageous insofar as, if appropriate, an optimum utilization of the available structural space is made possible thereby.

Downstream of the deflection device 210 in the light propagation direction, a Fourier optical unit 220 in the form of an optical zoom system is situated in the beam path, the Fourier optical unit being illustrated as a single lens element in a simplified manner in FIG. 1 and serving to convert the angular distribution of the light incident on the Fourier optical unit 220 into a spatial distribution in the downstream pupil plane PP. Such a Fourier optical unit is also designated as a condenser.

In the beam path there follow a light mixing device 103, which can have e.g. an arrangement of micro-optical elements suitable for obtaining light mixing, and a lens element group 104, downstream of which is situated a field plane with a reticle masking system (REMA) 105, which is imaged by a REMA lens 106 disposed downstream in the light propagation direction onto the structure-bearing mask (reticle) 150 arranged in a further field plane on a mask stage (also usually designated as "reticle stage") 151 and thereby delimits the illuminated region on the reticle.

The structure-bearing mask 150 is imaged by the projection lens 120 onto a substrate 106 provided with a light-sensitive layer, or onto a wafer, which is arranged on a wafer stage 161. The projection lens 120 can be designed, in particular, for immersion operation. Furthermore, it can have a numerical aperture NA of greater than 0.85, in particular greater than 1.1, and in particular greater than 1.3.

The configuration of the deflection device 210 and the functioning thereof in accordance with one exemplary embodiment of the present disclosure is explained below with reference to FIG. 2.

Figure 2:
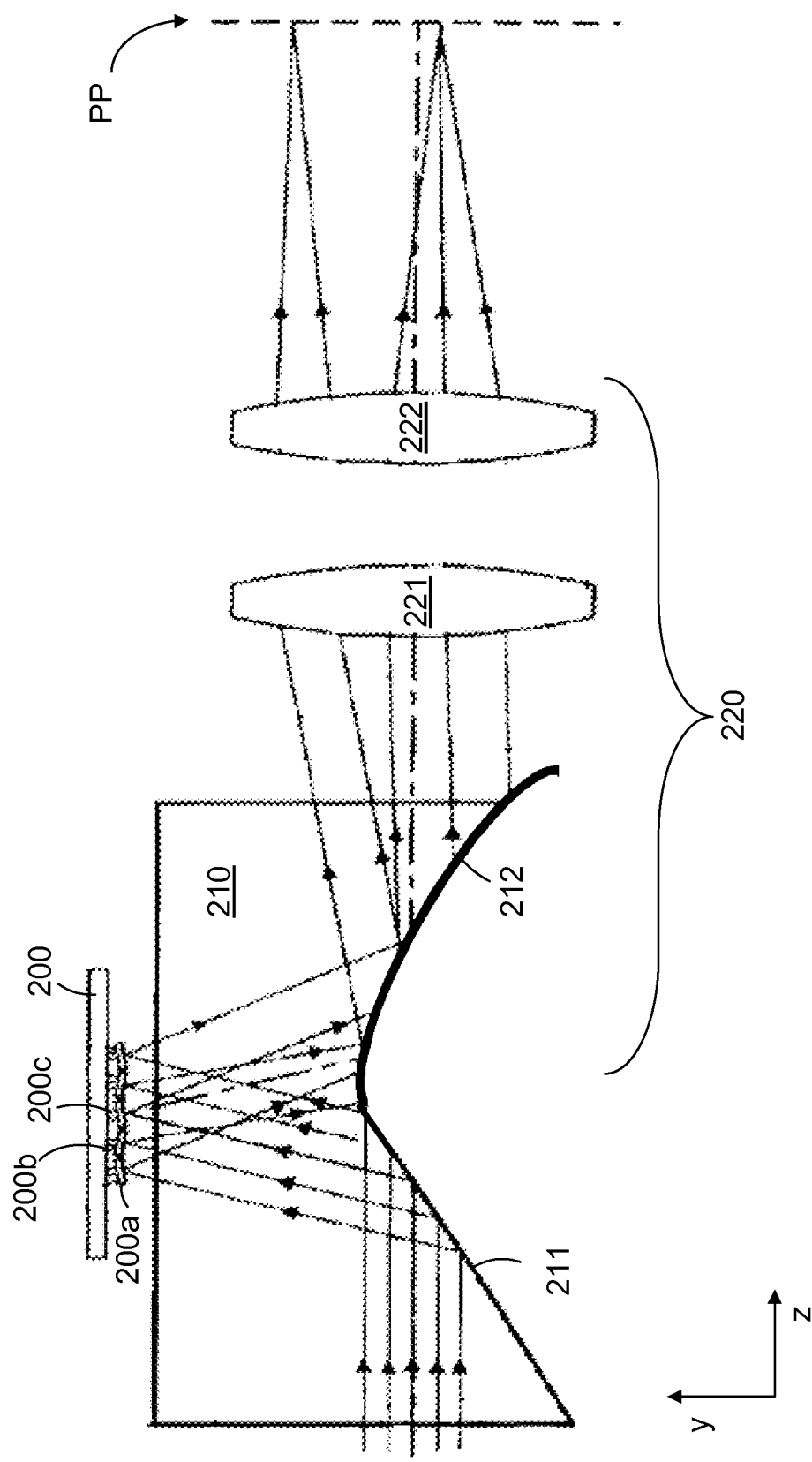
FIGS. 2-3 show schematic illustrations for elucidating exemplary embodiments of the present disclosure.

In accordance with FIG. 2, the deflection device 210 is configured in such a way that the deflection surface 212 arranged relative to the optical beam path downstream of the mirror arrangement 200 has refractive power.

Figure 3:
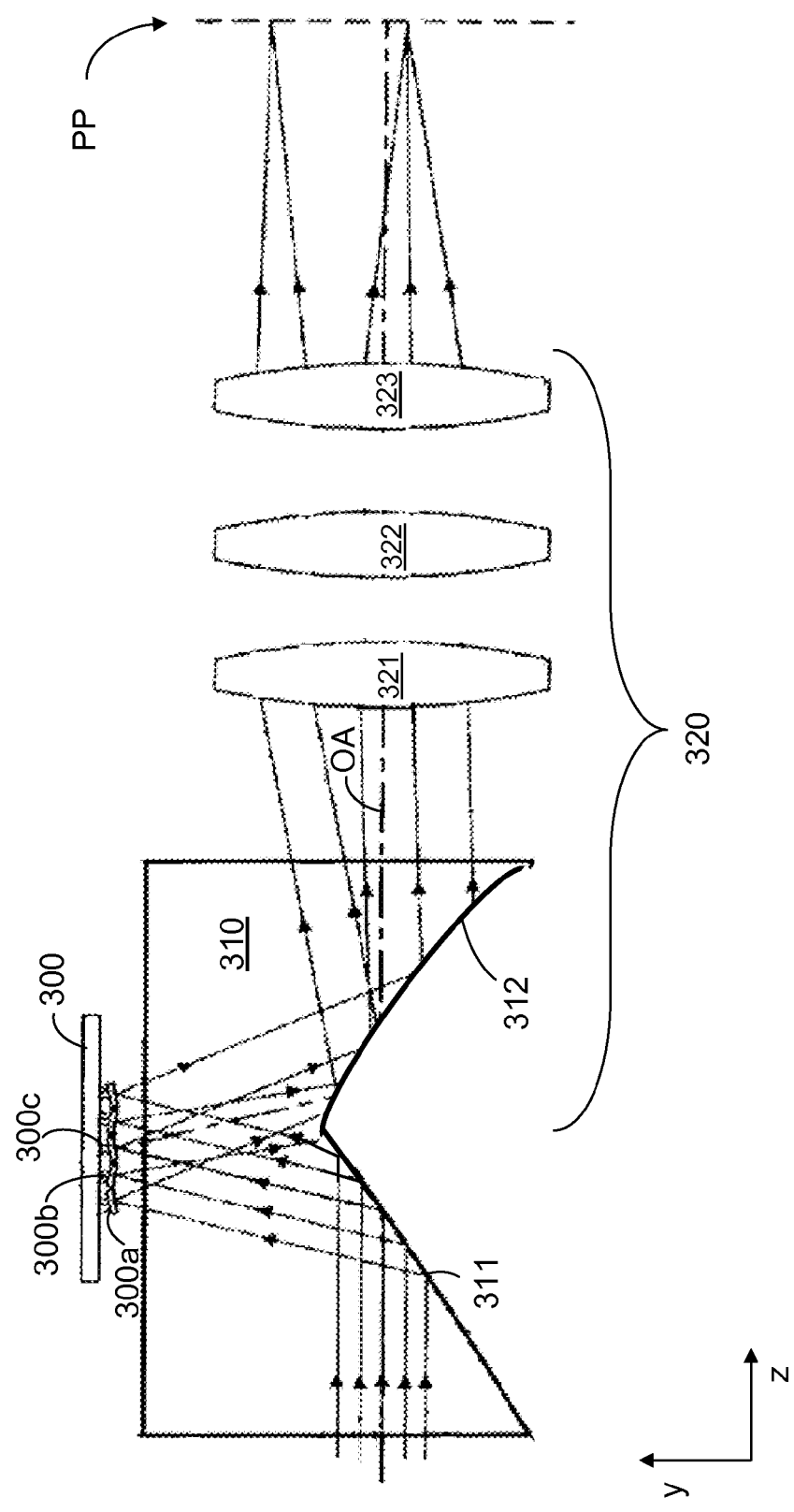
Figure 4:
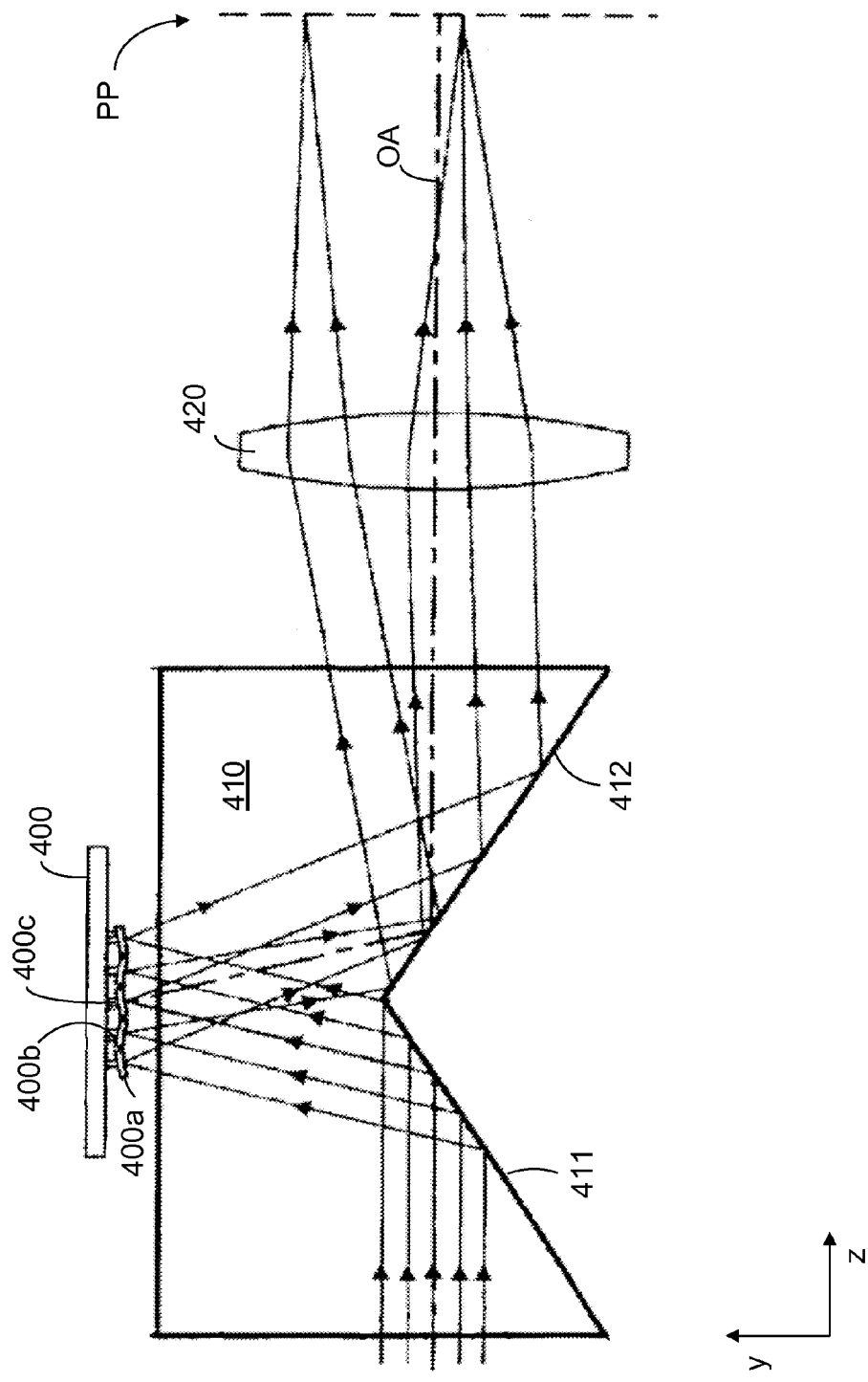
FIG. 4 shows a schematic illustration for elucidating the construction of an optical system in accordance with the prior art.

In other words, the deflection surface 212 does not merely bring about a reflection without refractive power for deflecting the optical axis OA of the optical system or of the illumination device, as is the case in FIG. 4, which shows a conventional arrangement known per se from US 2009/0116093 A1. Rather, according to the disclosure, the deflection surface 212 already introduces refractive power into the optical system with the consequence that part of the optical effect to be provided by the Fourier optical unit 220 (namely the conversion of the angular distribution of the illumination light into a spatial distribution in the pupil plane PP disposed downstream in the beam path) can already be realized by the deflection surface 212, such that the deflection surface 212 optically—on account of its refractive power—functionally becomes a part of the Fourier optical unit 220. This in turn affords the advantage that the Fourier optical unit 220 (which typically furthermore has a plurality of refractive lens elements, where merely by way of example two lens elements 221, 222 are illustrated in FIG. 2 and three lens elements 321, 322, 323 are illustrated in FIG. 3) can be configured with a shortened structural length, and thus more compactly, in comparison with a configuration of the deflection surface 212 without refractive power. In particular, this more compact configuration of the Fourier optical unit 220 can mean that at least one of the refractive lens elements of the Fourier optical unit 220 can be omitted.

FIG. 3 shows a schematic illustration of a corresponding arrangement including three lens elements 321, 322, 323 of the Fourier optical unit 320, wherein in comparison with FIG. 2 analogous or substantially functionally identical elements are designated by reference numerals increased by "100".

Even though, in accordance with FIG. 2 and FIG. 3, the lens elements 221, 222 and 321-323 of the Fourier optical unit 220 and 320 that are depicted by way of example directly follow the deflection surface 212 and 312 of the deflection device 210 and 310 in the optical beam path, the disclosure is not restricted thereto. Rather, in further embodiments of the disclosure, one or a plurality of further deflection surfaces can also be provided between the deflection surface 212 and 312 and the further lens elements 221, 222 and 321-323 of the Fourier optical unit 220 or 320 (or the first refractive lens elements 221 and 321 thereof).

Preferably, in the case, too, of the abovementioned configuration having a plurality of deflection surfaces between the mirror arrangement 200 and the Fourier optical unit 220, the first of the deflection surfaces relative to the optical beam path is configured with refractive power, since in this way the available structural space can be optimally utilized for the beam conversion to be brought about. However, the disclosure is not restricted in principle to this configuration either, such that the present application shall be deemed also to encompass configurations in which, of a plurality of deflection surfaces between the mirror arrangement 200 and the first refractive lens elements 221 of the Fourier optical unit 220, another of the deflection surfaces, rather than the first relative to the optical beam path, is provided with refractive power. Furthermore, it is also possible for two or more of such deflection surfaces to have refractive power.

As is evident from FIG. 2, in the exemplary embodiment illustrated, at the deflection surfaces 211, 212 of the deflection device 210, the beam deflection of the illumination light takes place in each case via total internal reflection, i.e. the illumination light impinges on the relevant deflection surfaces 211, 212 in each case at an angle of incidence that is less than the critical angle of total internal reflection for the relevant wavelength (e.g. 193 nm), i.e. the beam is incident more shallowly than the critical angle. The angle of incidence can be less than the critical angle of total internal reflection e.g. by 1°, in particular by 5°, which inter alia reduces the effect of finite roughnesses on the deflection surfaces 211, 212. Via total internal reflection, on account of the minimization of reflection losses, a particularly high transmission can be obtained in the optical system according to the disclosure. However, the disclosure is not restricted to this configuration, and so in further embodiments the deflection surfaces 211, 212 can also be realized by reflective mirror surfaces in the form of deflection mirrors (in which case the abovementioned restriction to angles of incidence that are less than the critical angle of total internal reflection is omitted).

As is likewise evident from FIG. 2, the mirror arrangement 200 and also the deflection device 210 are arranged in such a way that the mirror arrangement 200 is operated with substantially normal incidence, wherein the deflection device 210 or the deflection surfaces 211, 212 thereof bring about a double deflection (or "bending") of the optical axis by an angle of 90°, corresponding to an overall resulting deflection by 180°. Even though the operation of the mirror arrangement 200 with substantially normal incidence is advantageous in principle, the disclosure is not restricted to this either, and so in further embodiments deflections of the optical axis (for instance at the deflection surfaces 211, 212 of the deflection device 210) by other angles can also be realized.

Even if the disclosure has been described on the basis of specific embodiments, the person skilled in the art infers numerous variations and alternative embodiments, e.g. by combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the appended patent claims and the equivalents thereof.

What is claimed is:

1. An optical system having an optical axis, the optical system having an optical beam path along which light travels through the optical system during use of the optical system, the optical system comprising:
   a mirror arrangement comprising a plurality of mirror elements which are adjustable independently of one another to alter an angular distribution of light reflected by the mirror arrangement during use of the optical system; and
   a deflection device comprising a deflection surface having refractive power,
   wherein:
      the deflection surface is downstream of the mirror arrangement along the optical beam path;
      during use of the optical system, a deflection of the optical axis occurs at the deflection surface; and
      the optical system is a microlithographic optical system.

2. The optical system of claim 1, wherein:
   the optical system has a pupil plane downstream of the mirror arrangement; and
   along the optical beam path between the mirror arrangement and the pupil plane, the optical system has exactly one deflection surface at which a deflection of the optical axis occurs during use of the optical system.

3. The optical system of claim 1, wherein, along the optical beam path downstream of the mirror arrangement, the optical system comprises a plurality of deflection surfaces at which a deflection of the optical axis occurs during use of the optical system.

4. The optical system of claim 3, wherein, along the optical beam path downstream of the mirror arrangement, the deflection surface having refractive power is the first of the deflection surfaces along to the optical beam path at which a deflection of the optical axis occurs during use of the optical system.

5. The optical system of claim 1, wherein the deflection device comprises a prism.

6. The optical system of claim 1, wherein:
the deflection device has a further deflection surface;
the further deflection surface is upstream of the mirror arrangement along the optical beam path; and
during use of the optical system, a deflection of the optical axis occurs at the further deflection surface.

7. The optical system of claim 1, wherein the mirror elements have a maximum tilting angle of not more than 5°.

8. The optical system of claim 1, wherein, during use of the optical system, light passing along the optical beam path undergoes a total internal reflection due to the deflection surface.

9. The optical system of claim 1, wherein the at least one deflection surface comprises a deflection mirror.

10. The optical system of claim 1, further comprising a Fourier optical unit downstream of the mirror arrangement along the optical beam path,
wherein:
the optical system has a pupil plane downstream of the Fourier optical unit along the optical beam path; and
the Fourier optical unit is configured so that, during use of the optical system, the Fourier optical unit converts an angular distribution of light incident on the Fourier optical unit into a spatial distribution in the pupil plane.

11. The optical system of claim 10, wherein the Fourier optical unit comprises the deflection surface.

12. The optical system of claim 10, wherein the Fourier optical unit comprises more than one lens element.

13. The optical system of claim 12, wherein the Fourier optical unit comprises at most four lens elements.

14. The optical system of claim 13, wherein the optical system is configured to operate with light having a wavelength of less than 250 nm.

15. The optical system of claim 1, wherein the optical system is configured to operate with light having a wavelength of less than 250 nm.

16. An apparatus, comprising:
an illumination device comprising an optical system according to claim 1; and
a projection lens,
wherein the apparatus is a microlithographic projection exposure apparatus.

17. A method of operating a microlithographic projection exposure apparatus comprising an illumination device and a projection lens, the method comprising:
using the illumination device to illuminate a mask comprising structures, the illumination unit comprising an optical system according to claim 1; and
using the projection lens project at least one part of the mask onto a light-sensitive material.

18. The optical system of claim 1, wherein the deflection surface has a positive refractive power.

19. An optical system having an optical axis, the optical system having an optical beam path along which light travels through the optical system during use of the optical system, the optical system comprising:
a micromirror array; and
a deflection device comprising a deflection surface having refractive power,
wherein:
the deflection surface is downstream of the micromirror array along the optical beam path;
during use of the optical system, a deflection of the optical axis occurs at the deflection surface; and
the optical system is a microlithographic optical system.

20. An apparatus, comprising:
an illumination device comprising an optical system according to claim 19; and
a projection lens,
wherein the apparatus is a microlithographic projection exposure apparatus.

21. A method of operating a microlithographic projection exposure apparatus comprising an illumination device and a projection lens, the method comprising:
using the illumination device to illuminate a mask comprising structures, the illumination unit comprising an optical system according to claim 19; and
using the projection lens project at least one part of the mask onto a light-sensitive material.

22. The optical system of claim 19, wherein the deflection surface has a positive refractive power.

* * * * *